US007928797B2

(12) United States Patent  (10) Patent No.: US 7,928,797 B2
Valentian et al.  (45) Date of Patent: Apr. 19, 2011

(54) INTEGRATED CIRCUIT WITH A POWER TRANSISTOR GATE BIAS CONTROLLED BY THE LEAKAGE CURRENT

(75) Inventors: Alexandre Valentian, Saint Egreve (FR); Olivier Thomas, Revel (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 12/608,616

(22) Filed: Oct. 29, 2009

(65) Prior Publication Data
US 2010/0117720 A1 May 13, 2010

(30) Foreign Application Priority Data

Nov. 7, 2008 (FR) ...................................... 08 06228

(51) Int. Cl.
G05F 3/02 (2006.01)
G05F 1/10 (2006.01)
(52) U.S. Cl. ...................................... 327/537; 327/427
(58) Field of Classification Search .......... 327/535–537, 327/427, 434
See application file for complete search history.

(56) References Cited

U.S. PATENT DOCUMENTS

| 6,556,069 | B1 * | 4/2003 | Casier et al. | 327/540 |
| 6,690,148 | B2 * | 2/2004 | Harrison | 323/281 |
| 6,940,307 | B1 | 9/2005 | Liu et al. | |
| 2003/0151430 | A1 * | 8/2003 | Hakkarainen et al. | 327/94 |
| 2006/0006929 | A1 | 1/2006 | Caplan et al. | |

FOREIGN PATENT DOCUMENTS

FR 2 908 555 A 5/2008

OTHER PUBLICATIONS

T. Inukai, et al., "Boosted Gate MOS (BGMOS): Device/Circuit Cooperation Scheme to Achieve Leakage-Free Giga-Scale Integration", IEEE 2000Custome Integrated Circuits Conf.
Hiroshi Kawaguchi, et al., "A Super Cut-Off CMOS (SCCMOS) Scheme for 0.5-V Supply Voltage with Picoampere Stand-By Current", IEEE 2000, Oct. 2000, pp. 1498-1501, vol. 35, No.
Shin'Ichiro Mutoh, et al., "1-V Power Supply High-Speed Digital Circuit Tehcnology with Multithreshold-Voltage CMOS", IEEE 1995, Aug. 1995, pp. 847-854, vol. 30, No. 8.
Alexandre Valentian, et al., "Automatic Gate Biasing of an SCCMOS Power Switch Achieving Maximum Leakage Reduction and Lowering Leakage Current Variability", IEEE 2008, Jul. 2008.

* cited by examiner

*Primary Examiner* — Quan Tra
(74) *Attorney, Agent, or Firm* — LaRiviere, Grubman & Payne, LLP

(57) ABSTRACT

The invention relates to electronic integrated circuits capable of operating either in active mode or in standby mode and of having, in standby mode, a very low current consumption. According to the invention, the leakage current of a power transistor inserted in series between a supply terminal and an active circuit is controlled by a gate reverse overbias in the following manner: a voltage step-up charge pump generates a gate bias voltage from pulses delivered by an oscillator having its frequency controlled by a current. The control current Ic is the leakage current of a transistor having technological characteristics similar to those of the power transistor. The system optimizes the current consumption in standby mode, the frequency of the oscillator being reduced when the gate is biased so as to minimize the leakage current. The invention is applicable to circuits powered by a battery or a cell (mobile telephones, cameras, portable computers, etc.).

14 Claims, 2 Drawing Sheets

INTEGRATED CIRCUIT WITH A POWER TRANSISTOR GATE BIAS CONTROLLED BY THE LEAKAGE CURRENT

PRIORITY CLAIM

This application claims priority to French Patent Application Number 08 06228, entitled Integrated Circuit with a Power Transistor Gate Bias Controlled by the Leakage Current, filed on Nov. 7, 2008.

FIELD OF THE INVENTION

The invention relates to electronic integrated circuits capable of operating either in active mode or in standby mode and of having, in standby mode, a very low current consumption.

These circuits are necessary notably in applications in which the supply is delivered by a battery or a cell (mobile telephones, cameras, portable computers, etc.) so as not to needlessly consume energy from the power supply.

BACKGROUND OF THE INVENTION

In these applications, the circuits are generally produced in CMOS (complementary metal oxide semiconductor) technology which allows lower consumption than other technologies.

To switch from an active mode to a standby mode, as seen in FIG. 1, an MOS power transistor TP interposed in series between one of the supply terminals A or M of the integrated circuit and the active part of the circuit (CA) is in general provided in the integrated circuit. This transistor is controlled by a mode control circuit CGM which establishes on the gate of the transistor one voltage or another voltage depending on whether the integrated circuit is in active mode or in standby mode. The function of this power transistor is twofold:

- in active mode, it is made highly conducting and lets through all the current needed for the active circuit, with a minimal voltage drop and therefore without needless power consumption;
- in standby mode, it is blocked so as to interrupt the current from the supply voltage to the rest of the integrated circuit.

The power transistor must therefore meet several constraints: sufficiently high current in the on-state; very low voltage drop in the on-state; very low leakage currents in the off-state; and finally, if possible, dimensions as small as possible in order to reduce the footprint on the silicon of the integrated circuit.

Various types of power transistors attempting to meet this set of constraints have already been proposed in the prior art. Examples thereof are found notably in the following published documents:

"1-V Power Supply High Speed Digital Circuit Technology with Multithreshold-voltage CMOS", IEEE Journal of Solid State Circuits, Vol. 30, pp 847-854, August 1995 by S. Mutoh et al.;

"Boosted Gate OS (BGMOS): Device/Circuit Cooperation Scheme to Achieve Leakage-Free Giga-Scale Integration", Custom Integrated Circuits Conference, pp. 409-412, May 2000 by T. Inukai et al.; and "A super Cut-Off CMOS (SCCMOS) Scheme for 0.5 V Supply Voltage with Picoampere Stand-by Current", IEEE Journal of Solid State Circuits, Vol. 35 No 10, pp 1498-1501, October 2000 by H. Kawaguchi et al.

In the latter document, a power transistor having a low threshold voltage is used that delivers a high current in the on-state, the leakage current of which is reduced by reverse overbiasing the gate in standby mode. The term "reverse overbias" is understood to mean a bias at a voltage lower than the most negative terminal of the supply voltage for an nMOS transistor or higher than the most positive supply voltage for a pMOS transistor.

The type of power transistor of the last-mentioned document (SCCMOS) is that providing the best compromise between area occupied (for a given current in the on-state) and leakage current in the off-state.

It should be noted that the leakage current, which is firstly due to the conduction current $I_{STH}$ between source and drain (threshold current $I_{STH}$), decreases exponentially as the gate is biased more negatively (for an nMOS transistor). It may become extremely low, but other phenomena cause other leakage currents that may increase with the overbias voltage.

Reverse gate overbias control circuits have therefore already been proposed which establish a reverse overbias voltage which is neither too low nor too high. These control circuits are sophisticated—they include current sources, comparators, voltage step-up charge pumps, etc. They require themselves energy to operate, which goes counter to reducing consumption in the quiescent state. Such circuits have for example been proposed in the following publication: "Automatic Gate Biasing of an SCCMOS Power Switch Achieving Maximum Leakage Reduction and Lowering Leakage Current Variability", by A. Valentian and E. Beigne, published in IEEE Journal of Solid-State Circuits, Volume 43, No. 7, July 2008, pages 1688-1698.

It should also be noted that gate forward bias control circuits have already been proposed in the prior art using charge pumps operating at a variable frequency—see the U.S. Pat. No. 5,258,662.

One aim of the invention is to propose a gate reverse overbias control circuit having a minimal energy consumption.

SUMMARY OF THE INVENTION

According to the invention, what is proposed is an integrated circuit comprising a power transistor in series between a supply terminal and a use circuit, and a gate bias circuit for applying a forward bias potential to the gate of the power transistor in order to turn the transistor on and a reverse overbias potential for strongly blocking the transistor, the gate bias circuit comprising a voltage step-up charge pump delivering a reverse overbias potential to the gate of the power transistor, and an oscillator for applying pulses at the frequency of the oscillator to the charge pump, characterized in that the oscillator of the charge pump is an oscillator having its frequency controlled by a current and in that the oscillator control current is a drain current of an auxiliary transistor having technological characteristics representative of the power transistor, the gate and the source of the auxiliary transistor being connected to the gate and to the source of the power transistor, respectively.

The expression "technological characteristics representative of the power transistor", is understood to mean essentially the fact that the auxiliary transistor is produced with the same technological steps and parameters, in particular the same threshold voltage (and therefore the same channel doping level), as the power transistor.

The auxiliary transistor is preferably much smaller than the power transistor (if possible at least ten times smaller). It preferably has a gate length identical to that of the power transistor (which in practice is as short as possible while meeting the constraints of the technology used) and a much smaller gate width.

Correspondingly, in addition to the integrated circuit thus defined, the invention proposes a method of controlling the leakage current of a power transistor inserted in series between a supply terminal and a use circuit, in which the gate of the power transistor receives a forward bias voltage in conducting mode and a reverse overbias voltage in blocking mode, the method comprising the use of an oscillator and of a voltage step-up charge pump receiving pulses from the oscillator in order to produce the reverse overbias voltage, characterized in that the oscillator is an oscillator having its frequency controlled by a current, and the control current of the oscillator is a drain current of an auxiliary transistor, having technological characteristics representative of the power transistor, the gate and the source of which are connected to the gate and to the source of the power transistor, respectively.

Thus, the basic principle of the operation is the following: the auxiliary transistor receives the same reverse overbias voltage as the power transistor. It therefore lets through only a leakage current, and it is this leakage current that controls the frequency of the oscillator. If the leakage current is high (and it is therefore high both for the power transistor and for the auxiliary transistor), the frequency of the oscillator increases and the reverse overbias voltage also increases, thereby tending to reduce the leakage current. The frequency of the oscillator is consequently reduced and, as a result of this, the reverse overbias voltage increases less quickly or ceases to increase.

This principle operates well without the need for complementary regulation circuits insofar as the variations in reverse overbias voltage remain within a limited range (a range in which the leakage current decreases as the reverse overbias voltage increases). The frequency of the oscillator stabilizes at a relatively low value, thereby reducing the energy consumption in standby mode compared with the consumption of a circuit in which the oscillator and the charge pump operate at a fixed frequency.

However, a second phenomenon must be taken into account—this is the appearance of a gate-induced drain current ($I_{GIDL}$) because of the relatively high gate voltage. By reverse-biasing the gate, a leakage current no longer appears between drain and source but between drain and substrate of the integrated circuit. Typically, in the configuration shown in FIG. 1 in which the power transistor TP is a pMOS transistor, the source of which is connected to the most positive supply terminal A, the gate is raised to an even higher potential in blocking mode, whereas the drain remains practically at the potential of the terminal M, which is the low potential of the supply. An electron in the valence band can pass through the tunnel effect into the conduction band, thereby generating electron-hole pairs at the point where the gate overhangs the edge of the drain, because of the high electric field that exists vertically at this point between gate and drain. Other electron-hole pairs may also be thermally generated in the drain. Once the electron-hole pairs have been generated, the majority carriers (electrons in the case of an nMOS transistor and holes in the case of a pMOS transistor) are sent towards the drain and the minority carriers are sent towards the substrate because of the lateral electric field—there is therefore a drain-substrate current. The presence of this current tends to maintain the presence of a depletion zone, and the process for generating electron-hole pairs by the tunnel effect may continue without creating an inversion layer. This current $I_{GIDL}$ or gate-induced drain current significantly increases when the reverse voltage between gate and drain increases—the increase is approximately exponential.

The gate reverse overbias therefore generates an additional leakage current $I_{GIDL}$ for the supply battery of the circuit, and this current strongly increases with the overbias level. This means that, if the negative gate-source voltage (nMOS transistor) or positive gate-source voltage (pMOS transistor) increases excessively, the strong reduction in leakage current between source and drain serves for no purpose since another leakage source becomes predominant.

To summarize, the forward leakage current between source and drain decreases with the reverse overbias voltage, whereas the additional leakage current $I_{GIDL}$ increases with the reverse overbias voltage. It is therefore preferable, according to an important improvement in the method according to the invention, to provide for the pulses output by the oscillator to be applied to the charge pump under the control of a current comparator which compares the leakage currents of second and third additional auxiliary transistors having technological characteristics representative of those of the power transistor, the second auxiliary transistor having both its source and its gate connected to the source and the gate of the power transistor and its drain connected to a first input of the current comparator, and the third auxiliary transistor having its gate connected to the gate of the power transistor and both its source and its drain connected together and connected to a second input of the current comparator.

Thus, the gate reverse overbias circuit according to the invention further includes means for preventing an increase in overbias potential at the output of the charge pump above a certain value. Preferably, this value is that which makes the forward leakage current $I_{STH}$ (which decreases as the overbias voltage increases) equal to the additional leakage current $I_{GIDL}$ (which increases with overbias voltage). The current comparator used for this purpose receives first and second currents which are derived from the various leakage currents of the identical auxiliary transistors similar to the power transistor but smaller than that, these leakage currents becoming equal when the forward leakage current $I_{STH}$ becomes equal to the additional leakage current $I_{GIDL}$.

In practice, the first current is delivered by a second auxiliary transistor which is mounted in such a way that it sends, to a first input of the current comparator, a current which is the sum of all the leakage currents of this transistor. The second current is delivered by a third auxiliary transistor having the same dimensions as the second transistor, which is mounted in such a way that that it sends, to a second input of the comparator, a current which is twice the gate-induced drain current. Since the transistors are identical, the difference between these currents becomes zero when the h a power leakage current beneath the gate $I_{STH}$ is equal to the gate-induced drain current $I_{GIDL}$.

BRIEF DESCRIPTION OF DRAWINGS

Other features and advantages of the invention will become apparent on reading the following detailed description made with reference to the appended drawings in which.

DESCRIPTION OF PREFERRED EMBODIMENTS

Figure 1:
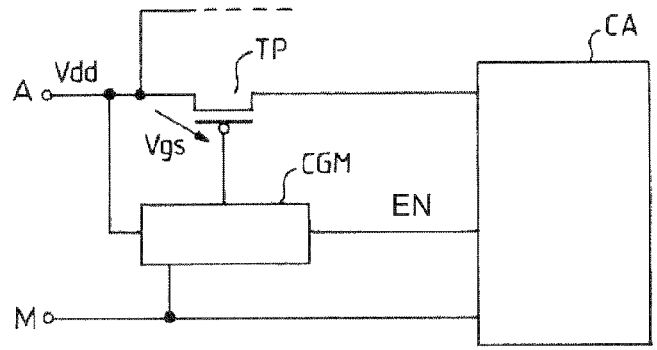
FIG. 1 shows the configuration of a circuit having an active mode and a standby mode, with a power transistor in series in order to control the switching of one mode to the other.

The main active part CA of the integrated circuit of FIG. 1 possesses any functionality (for example telephony in the case of a telephone, image acquisition in the case of a camera, etc.). This functionality is provided with an active mode and a standby mode. The standby mode can typically be activated all by itself after a predetermined period of time not in use, or else it may be activated upon request by a user.

There are two supply terminals A and M which directly supply the circuits that have to remain permanently supplied and which supply indirectly the active circuit CA througtransistor TP in series between one of the supply terminals and the circuit CA.

In standby mode, the supply for the active circuit CA is cut off by the transistor. Only a few circuits having a low consumption remain supplied, for example a circuit (not shown) for detecting a request to return to active mode and a mode management circuit CGM which controls the gate of the power transistor.

In what follows, the supply terminal A is considered to be a positive supply terminal at a voltage Vdd and the terminal M is a supply terminal considered as a ground (zero potential) terminal, and therefore more negative than the terminal A. The power transistor TP is a pMOS transistor and its source is connected to the terminal A. However, it will be understood that the transistor TP could be an nMOS transistor inserted on the other supply conductor, i.e. between the terminal M and the active circuit, the source of the transistor being connected to the terminal M.

The drain of the transistor TP is connected to the active circuit CA, which is the circuit for using the current transmitted by the power transistor. This circuit receives a supply current only if the transistor TP is conducting.

The mode control circuit CGM therefore has two possible operating states: in a first state corresponding to the active mode, it establishes a zero voltage (voltage of the terminal M) on the gate of the transistor TP, so as to sharply turn on the transistor with a very low voltage drop; in a second state corresponding to the standby mode, it establishes a blocking voltage on the gate of the transistor so that the transistor no longer passes a current. The mode control circuit CGM is therefore essentially a circuit for biasing the gate of the transistor TP. It comprises an input EN which defines the mode and which may come from the circuit CA or from elsewhere.

If the power transistor TP has quite a high threshold voltage (in absolute value), it is sufficient for the voltage applied to the gate in standby mode to be equal to the voltage on the terminal A in order for the current flow to be strongly blocked, and in this case the mode control circuit CGM may be extremely simple to produce since it is sufficient to raise the gate either to the potential of ground M or to the potential of the terminal A. However, the drawback is that a power transistor produced in a technology that gives it a high threshold voltage must be quite large in size, otherwise the forward voltage drop (for a given supply current) would be too high. This relatively large size is prejudicial in terms of fabrication costs.

If the power transistor TP has a lower threshold voltage (obtained by an appropriate choice of channel doping), permitting a smaller transistor size, then the blocking runs the risk of being imperfect if merely the same potential as on the source is applied to the gate.

This is why, in this case, the circuit CGM is designed to apply an even more positive reverse overbias voltage to the gate than the voltage Vdd present on the terminal A.

Figure 2:
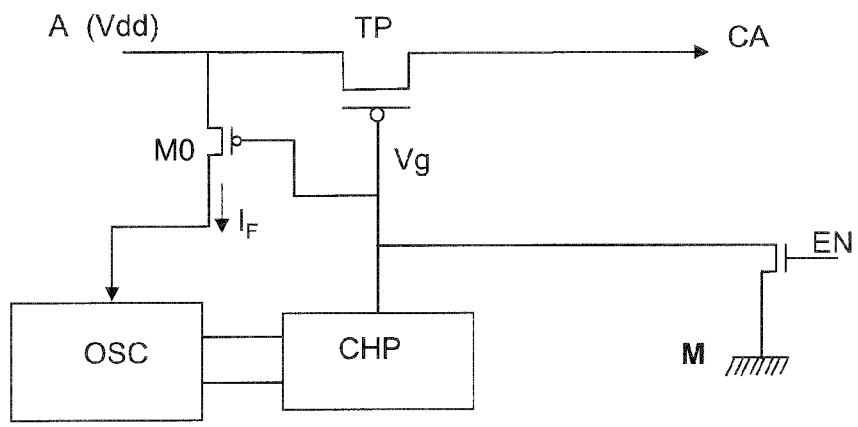
FIG. 2 shows the principle of a circuit according to the invention.

FIG. 2 shows a simple exemplary embodiment of the invention in the case in which the power transistor is a pMOS transistor mounted as in FIG. 1.

The circuit has an input EN for receiving a mode control logic signal. If the mode is the active mode, the command EN is at the high logic level (1)—it turns an nMOS transistor T1 on, which grounds the gate of the transistor TP, turning the latter (pMOS) transistor off. If the mode is the standby mode, the command EN is at the low logic level (0), turning the transistor T1 off and activating a gate reverse overbias circuit which applies a potential Vg greater than the potential Vdd of the terminal A to the gate of TP.

This overbias circuit mainly comprises a variable-frequency oscillator OSC and a voltage step-up charge pump CHP controlled by the pulses from the oscillator. The charge pump delivers an output voltage Vg which increases the higher the frequency F of the pulses delivered by the oscillator and which increases slowly or even decreases when the frequency decreases.

The oscillator is an oscillator having its frequency controlled by a current $I_F$: the higher the current, the higher the frequency and, conversely, the lower the current, the lower the frequency.

As a result, the higher the supply current $I_F$, the more the reverse overbias voltage Vg on the output of the charge pump tends to increase, and when this current decreases, the reverse overbias voltage increases less quickly or ceases to increase, or even tends to be reduced.

According to the invention, provision is made for the current $I_F$ to be delivered by an auxiliary transistor M0 having technological characteristics representative of those of the power transistor, but of smaller size in order to limit the current consumption. The expression "representative technological characteristics" is understood essentially to mean the fact that it is produced with the same technological steps and parameters, in particular the same threshold voltage (and therefore the same channel doping level). It is preferably at least ten times smaller than the power transistor TP and its leakage current is reduced in the same proportion. Its length is preferably identical to that of the power transistor TP and it is therefore its width which is at least ten times smaller. The length of the power transistor is in principle as short as possible, within the acceptable limits depending on the imposed technology, so that this internal resistance is as low as possible.

The transistor M0 receives, on its gate and on its source, the same potentials that are applied to the gate and to the source of the power transistor respectively. Consequently, in standby mode, it also receives a gate reverse overbias voltage Vg. It is therefore strongly blocked and only its leakage current passes therethrough, said current being dependent on the reverse overbias voltage Vg. The control current $I_F$ is therefore the leakage current of the auxiliary transistor, which is proportional to the leakage current of the power transistor TP.

The reverse overbias voltage Vg stabilizes around a sufficiently high value above which a further increase in bias voltage does not significantly decrease the leakage current $I_F$ or above which a reduction in the leakage current $I_F$ does not significantly reduce the frequency.

Figure 3:
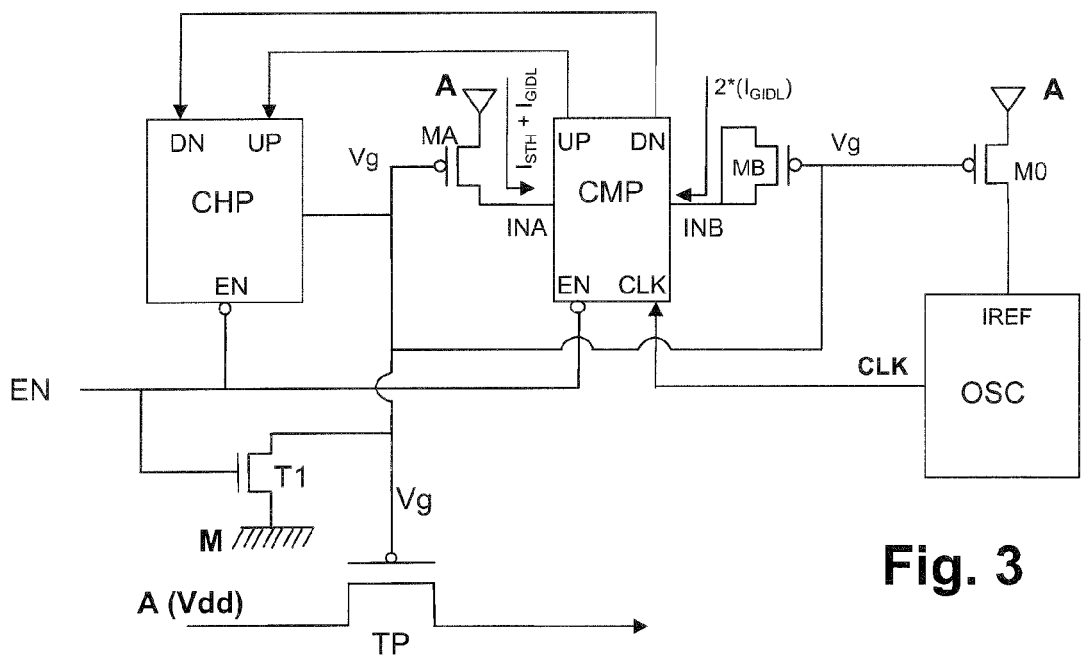
FIG. 3 shows a preferred embodiment that takes into account the gate-induced leakage current ($I_{GIDL}$)

A preferred embodiment shown in FIG. 3 takes into account the fact that the overall leakage current of the power transistor decreases up to a certain value $Vg_0$ of the reverse overbias voltage, but then progressively increases as Vg increases so that an optimum bias is that for which the leakage current passes through a minimum.

Patent application FR 2 908 555 has shown that this minimum is located approximately at the voltage $Vg_0$ for which the direct leakage current between drain and source ($I_{STH}$) is approximately equal to the gate-induced drain current ($I_{GIDL}$) and has shown how the equality point can be found using a current comparator that compares the overall leakage current ($I_{STH}+I_{GIDL}$) of a first auxiliary transistor with twice the gate-induced leakage current ($2*I_{GIDL}$) in a second auxiliary transistor identical to the previous one. The current comparator described in that prior patent delivers pulses derived from a fixed-frequency oscillator.

In the present invention, this current comparator CMP is inserted between the oscillator OSC having its frequency controlled by the leakage current of the auxiliary transistor M0 and the charge pump CHP. The current comparator delivers pulses UP and DN at the variable frequency of the oscillator, these pulses being intended for inputs UP and DN of the charge pump.

The current comparator CMP receives on a first input the drain current of a second auxiliary transistor MA, the source of which is connected to the same potential Vdd as the source of the power transistor and the gate of which receives the same bias voltage Vg as the power transistor. The comparator receives on a second input the source current and the drain current that are induced by the gate of a third auxiliary transistor MB which receives on its gate the voltage Vg and which has its source and its drain joined (as floating potential) and connected to the second input of the comparator. The auxiliary transistors MA and MB are identical to each other and preferably identical to the auxiliary transistor M0, the three transistors having technological characteristics representative of the power transistor, but of much smaller geometry.

The comparator CMP further includes an activation input which receives the command signal EN and permits it to be activated only in standby mode. It has an input InA and an input InB to which the currents to be compared, coming from the transistors MA and MB, are applied respectively. The comparator CMP also receives a clock signal CLK at the frequency F, coming from the variable-frequency oscillator OSC, and it produces two complementary signals UP and DN at the frequency F, these signals indicating which of the input currents of the comparator is the larger.

In the preferred exemplary embodiment, the signals UP and DN are short complementary logic pulses produced at the clock frequency F and their effect is to slightly increase or slightly reduce the voltage Vg at each clock pulse so that the voltage Vg stabilizes to an average value in which the currents $I_{STH}$ and $I_{GIDL}$ are the same.

Figure 4:
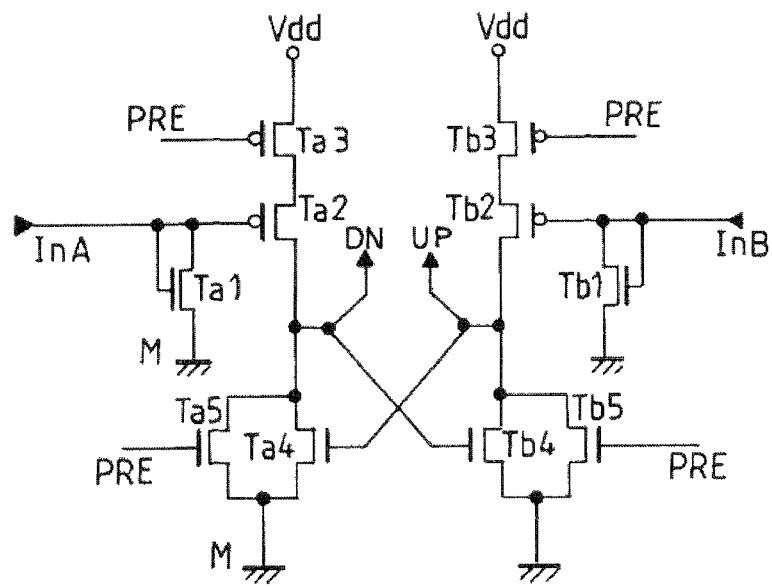
FIG. 4 shows a current comparator.

The current comparator used may be in accordance with that shown in FIG. 4 and described in detail in patent application FR 2 908 555.

The comparator of FIG. 4 operates in the following manner: the input InA that receives the drain current of the transistor MA is connected to the gate and to the drain of an nMOS transistor Ta1 mounted as a diode and having its source connected to ground M, the input InA also being connected to the gate voltage of a pMOS transistor Ta2. Likewise, the input InB is connected to an nMOS transistor Tb1 mounted as a diode between InB and ground M and connected to the gate of a pMOS transistor Tb2.

The transistors Ta2 and Tb2 form part of a pair of differential branches each comprising three transistors Ta3, Ta2 and Ta4 in series (first branch) or Tb3, Tb2, Tb4 in series (second branch). The transistors Ta3 and Tb3 are pMOS transistors having their source at the supply voltage Vdd and their gate controlled by a precharge signal PRE. The precharge signal PRE, normally at level 1, passes periodically through zero (with a period of the clock CLK) in order to trigger a comparison step.

The transistor Ta2 is a pMOS transistor which has its source connected to the drain of Ta3 and its drain connected to the drain of the nMOS transistor Ta4. The source of the transistor Ta4 is at ground. The combined drains of Ta2 and Ta4 form the output DN of the current comparator. The configuration is the same for the second branch, the transistors Tb3, Tb2 and Tb4 being mounted like the transistors Ta3, Ta2 and Ta4. The combined drains of the transistors Tb2 and Tb4 form the complementary output DN of the current comparator.

The gate of the transistor Ta4 is connected to the output UP and the gate of Tb4 is connected to the output DN, this crossover between the differential branches forming an unstable flip-flop tending to make the output UP and the output DN switch very rapidly into complementary stable logic states if a slight current imbalance appears in the differential branches.

Finally, an nMOS transistor Ta5 in parallel with the transistor Ta4, and an nMOS transistor Tb5 in parallel with the transistor Tb4 are controlled by the precharge signal PRE in order to maintain the outputs UP and DN at zero outside the comparison phase defined by the signal PRE.

The signals produced by the current comparator at the periodicity of the precharge pulse (the period of CLK) are therefore short pulses on one of the two outputs UP and DN, the other output remaining at zero.

Figure 5:
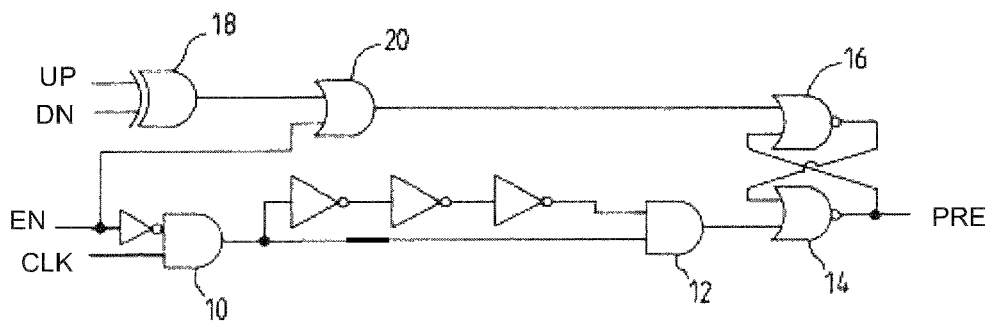
FIG. 5 shows a circuit delivering a precharge circuit.

FIG. 5 shows a circuit forming part of the current comparator, which circuit is used for periodically generating a very short precharge pulse PRE. The circuit uses the output signals UP and DN of the comparator themselves to interrupt the precharge pulse.

This circuit receives the clock CLK and the mode control signal EN. For the active mode (EN=1), the signal PRE remains permanently at 1 and there is never a precharge pulse. UP and DN remain at zero and the circuit of FIG. 6 that generates the voltage Vg leaves the latter floating, in such a way that the value of the voltage Vg, dictated by the transistor T1 of FIG. 3, is zero.

For the standby mode (EN=0), the AND gate 10 transmits the clock CLK and its complement delayed by series-connected inverters, to the inputs of an AND gate 12 so as to produce a very short trigger pulse on the rising edge of the clock signal. This pulse, applied to a first input of a flip-flop RS formed by two NOR gates 14 and 16 looped together, makes the output signal PRE of this flip-flop, initially at 1, switch to zero. The comparison process is then triggered in the current comparator circuit of FIG. 4 and causes the output UP or the output DN to switch to the high level.

An Exclusive-OR gate 18 receives the signals UP and DN and delivers a signal, in general zero (since UP and DN are usually at 0), which switches to 1 on the appearance of the high level on the output UP or DN of the comparator.

As soon as UP or DN switches to 1, the other remaining at zero, the output of the Exclusive-OR gate 18 switches to 1. This output is connected to an input of an OR gate 20, which has EN=0 on its other input, and the output of the OR gate 20 switches from zero to 1, which switching to 1 toggles the flip-flop 14, 16 in the other direction, thereby resetting the signal PRE to 1.

The precharge signal PRE remains at 1 until the next rising edge of the clock, or remains at 1 if the circuit switches to active mode (EN=1; blocking the clock; maintaining the output of the gate 12 at zero and the output of the gate 20 at 1; therefore immobilizing the flip-flop RS).

Figure 6:
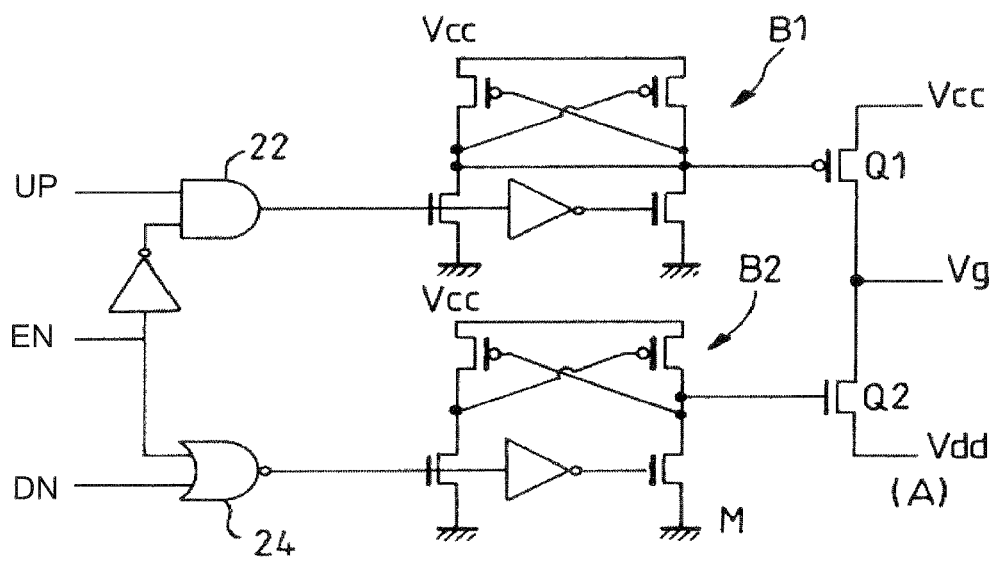
FIG. 6 shows a voltage step-up charge pump circuit.

Finally, FIG. 6 shows an example of a voltage step-up charge pump that can operate with the signals UP and DN obtained at the variable frequency F via the comparator of FIG. 4.

The charge pump CHP of FIG. 6 has an input EN which inhibits it when EN=1, i.e. in active mode. An AND gate 22 receives the complement of EN and the input UP. Its output delivers a short pulse of logic level 1 in standby mode when the current comparison provides a short level 1 pulse on the input UP. For the input DN, a NOR gate 24 receives EN and the input DN. The output of the gate 24, normally at 1, delivers a short pulse of logic level 0 in standby mode when the current comparison provides a short level 1 pulse on the input DN.

Two transistors Q1 (pMOS) and Q2 (nMOS) are connected in series in an analogue push-pull arrangement between two DC voltages Vdd and Vcc (Vcc being greater than Vdd; Q1 connected to Vcc; Q2 connected to Vdd). The junction point of the drains of these transistors delivers the desired bias voltage Vg, which is the output voltage of the charge pump. The drains are in general at high impedance since the gate of Q1 is normally brought to the higher potential Vcc and the gate of Q2 is brought to ground potential (lower than Vdd).

If a level 1 pulse appears at the output of the AND gate 22, a flip-flop B1 controlled by this output causes the potential on the gate of Q1 to switch to zero. Q1 becomes conducting over the duration of this pulse and tends to raise the potential Vg. There is no action on the transistor Q2, which remains off. At the end of the pulse, the potential Vg has risen slightly.

Conversely, if a level 1 pulse appears at the output of the NOR gate 24, a flip-flop B2 controlled by this output causes the potential on the gate of Q2 to switch to Vcc (higher than Vdd, the difference between Vcc and Vdd being greater than the threshold voltage of Q2). Q2 becomes conducting over the duration of this pulse and tends to lower the voltage Vg. There is no action on the transistor Q1, which remains off. When the pulse is interrupted, the potential Vg has dropped slightly.

This gate reverse overbias circuit must use not only the ground potential (connection to the terminal M) and the potential Vdd (connection to the terminal A) but also a potential Vcc higher than that of the terminal A. The higher potential Vcc may be obtained either directly if, for one reason or another, it is present in the integrated circuit, for example on an external connection terminal, or indirectly, for example by means of a charge pump. The way in which a higher voltage than the general supply voltage is produced by means of a charge pump is conventional. To give an example, the supply voltage Vdd is 1.2 volts, this being standard for small portable devices, and the higher voltage Vcc may be 2.5 volts.

Other circuits may be used, based on diodes and capacitors, for producing the charge pump CHP.

The invention claimed is:

1. Integrated circuit comprising a power transistor in series between a supply terminal and a use circuit, and a gate bias circuit for applying a forward bias potential to the gate of the power transistor in order to turn the power transistor on and a reverse overbias potential for strongly blocking the power transistor, the gate bias circuit comprising a charge pump delivering a reverse overbias potential to the gate of the power transistor, and an oscillator for applying periodic pulses to the charge pump, wherein the oscillator is an oscillator having its frequency controlled by a current and the oscillator control current is a drain current of an auxiliary transistor having technological characteristics representative of the power transistor, the gate and the source of the auxiliary transistor being connected to the gate and to the source of the power transistor, respectively.

2. Integrated circuit according to claim 1, wherein the auxiliary transistor is at least ten times smaller than the power transistor.

3. Integrated circuit according to claim 2, wherein the auxiliary transistor has a gate length identical to that of the power transistor.

4. Integrated circuit according to claim 1, wherein the gate bias circuit comprises a current comparator which compares the leakage currents of second and third auxiliary transistors having technological characteristics representative of those of the power transistor, the second auxiliary transistor having both its source and its gate connected to the source and the gate of the power transistor and its drain connected to a first input of the current comparator, and the third auxiliary transistor having its gate connected to the gate of the power transistor and both its source and its drain connected together and connected to a second input of the current comparator.

5. Integrated circuit according to claim 4, wherein the current comparator receives a frequency from the oscillator and delivers complementary pulses at the frequency of the oscillator to the charge pump depending on the result of the comparison.

6. Integrated circuit according to claim 4, wherein the second and third transistors are identical and at least ten times smaller than the power transistor.

7. Method of controlling the leakage current of a power transistor inserted in series between a supply terminal and a use circuit, in which the gate of the power transistor receives a forward bias voltage in conducting mode and a reverse overbias voltage in blocking mode, the method comprising the use of an oscillator and of a charge pump receiving pulses from the oscillator in order to produce the reverse overbias voltage, wherein the oscillator is an oscillator having its frequency controlled by a current, and the control current of the oscillator is a drain current of an auxiliary transistor, having technological characteristics representative of the power transistor, the gate and the source of which are connected to the gate and to the source of the power transistor, respectively.

8. Leakage current control method according to claim 7, wherein the pulses from the oscillator are applied to the charge pump under the control of a current comparator which compares the leakage currents of second and third auxiliary transistors having technological characteristics representative of those of the power transistor, the second auxiliary transistor having both its source and its gate connected to the source and the gate of the power transistor and its drain connected to a first input of the current comparator, and the third auxiliary transistor having its gate connected to the gate of the power transistor and both its source and its drain connected together and connected to a second input of the current comparator.

9. Integrated circuit according to claim 2, wherein the gate bias circuit comprises a current comparator which compares the leakage currents of second and third auxiliary transistors having technological characteristics representative of those of the power transistor, the second auxiliary transistor having both its source and its gate connected to the source and the gate of the power transistor and its drain connected to a first input of the current comparator, and the third auxiliary transistor having its gate connected to the gate of the power transistor and both its source and its drain connected together and connected to a second input of the current comparator.

10. Integrated circuit according to claim 3, wherein the gate bias circuit comprises a current comparator which compares the leakage currents of second and third auxiliary transistors having technological characteristics representative of those of the power transistor, the second auxiliary transistor having both its source and its gate connected to the source and the gate of the power transistor and its drain connected to a first input of the current comparator, and the third auxiliary transistor having its gate connected to the gate of the power transistor and both its source and its drain connected together and connected to a second input of the current comparator.

11. Integrated circuit according to claim 9, wherein the current comparator receives a frequency from the oscillator and delivers complementary pulses at the frequency of the oscillator to the charge pump depending on the result of the comparison.

12. Integrated circuit according to claim 9, wherein the second and third transistors are identical and at least ten times smaller than the power transistor.

13. Integrated circuit according to claim 10, wherein the current comparator receives a frequency from the oscillator and delivers complementary pulses at the frequency of the oscillator to the charge pump depending on the result of the comparison.

14. Integrated circuit according to claim 10, wherein the second and third transistors are identical and at least ten times smaller than the power transistor.

* * * * *